United States Patent
Forrest et al.

(10) Patent No.: US 7,314,773 B2
(45) Date of Patent: Jan. 1, 2008

(54) LOW RESISTANCE THIN FILM ORGANIC SOLAR CELL ELECTRODES

(75) Inventors: Stephen Forrest, Princeton, NJ (US); Jiangeng Xue, Piscataway, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 299 days.

(21) Appl. No.: 11/205,122

(22) Filed: Aug. 17, 2005

(65) Prior Publication Data

US 2007/0178619 A1   Aug. 2, 2007

(51) Int. Cl.
   *H01L 21/00*   (2006.01)
(52) U.S. Cl. .................................. 438/48; 257/E21.023
(58) Field of Classification Search .................. 438/48, 438/49; 257/E21.023
   See application file for complete search history.

(56) References Cited

U.S. PATENT DOCUMENTS

| | | | |
|---|---|---|---|
| 5,701,055 A | 12/1997 | Nagayama et al. | |
| 5,703,436 A | 12/1997 | Forrest et al. | |
| 5,773,931 A | 6/1998 | Shi et al. | |
| 6,016,033 A | 1/2000 | Jones et al. | |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,440,769 B2 | 8/2002 | Peumans et al. | |
| 6,451,415 B1 | 9/2002 | Forrest et al. | |
| 6,580,027 B2 | 6/2003 | Forrest et al. | |
| 6,657,378 B2 | 12/2003 | Forrest et al. | |
| 6,825,363 B2 | 11/2004 | Tian et al. | |
| 6,838,231 B2 | 1/2005 | Kobayashi et al. | |
| 6,846,606 B1 | 1/2005 | Laney et al. | |

2005/0110007 A1   5/2005   Forrest et al.

OTHER PUBLICATIONS

Models: USF-32, USF-11, USF-5 [online], [retrieved on Jun. 27, 2006]. Retrieved from the Internet: http://www.oksolar.com/solar_panels/unisolar_flexibles.htm.

Uni-power:Solar Electric Modules:Models: US-64, US-42, US-32 [online], [retrieved on Sep. 14, 2004]. Retrieved from the Internet: http://www.solarenergyalliance.com/pdf/US_32_42_64_Spec_Sheet.pdf.

(Continued)

*Primary Examiner*—Scott B. Geyer
*Assistant Examiner*—Elias Ullah
(74) *Attorney, Agent, or Firm*—Kenyon & Kenyon LLP (57) ABSTRACT

A method which lower the series resistance of photosensitive devices includes providing a transparent film of a first electrically conductive material arranged on a transparent substrate; depositing and patterning a mask over the first electrically conductive material, such that openings in the mask have sloping sides which narrow approaching the substrate; depositing a second electrically conductive material directly onto the first electrically conductive material exposed in the openings of the mask, at least partially filling the openings; stripping the mask, leaving behind reentrant structures of the second electrically conductive material which were formed by the deposits in the openings of the mask; after stripping the mask, depositing a first organic material onto the first electrically conductive material in between the reentrant structures; and directionally depositing a third electrically conductive material over the first organic material deposited in between the reentrant structures, edges of the reentrant structures aligning deposition so that the third electrically conductive material does not directly contact the first electrically conductive material, and does not directly contact the second electrically conductive material.

13 Claims, 6 Drawing Sheets

OTHER PUBLICATIONS

Thin-Film Photovoltaics: Amorphous Silicon (a-Si) Solar Technology [online], [retrieved on Sep. 14, 2004]. Retrieved from the Internet: http://www.uni-solar.com/Our_Technology_a_Si.html.

Guha, S., Yang, J. and Banerjee, A., Amorphous Silicon Alloy Photovoltaic Research—Present and Future [online], 2000 [retrieved on Sep. 14, 2004]. Retrieved from the Internet: http://www3.interscience.wiley.com/cgi-bin.

Feng et al. "Model Development for Image Reversal Resist Lithography" Microwave Technology Division, Hewlett-Packard Company, Santa Rosa, CA, 1999.

Peumans et al. "Efficient Photon Harvesting at High Optical Intensities in Ultrathin Organic Double-Heterostructure Photovoltaic Diodes" Appl.Phys. Lett. 76, pp. 2650-2652, 2000.

"Inorganic Chemistry" (2nd Edition) by Gary L. Miessler and Donald A. Tarr, Prentice Hall, pp. 1-3, 422-424, 442, Aug. 1999 version.

LOW RESISTANCE THIN FILM ORGANIC SOLAR CELL ELECTRODES

UNITED STATES GOVERNMENT RIGHTS

This invention was made with U.S. Government support under Contract No. 339-6002 awarded by the U.S. Air Force Office of Scientific Research and under Contract No. 341-4141 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to the manufacturing of organic photosensitive optoelectronic devices. More specifically, it is directed to a method for building an organic photosensitive optoelectronic devices having a low resistance transparent electrode.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before germinate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

Figure 1:
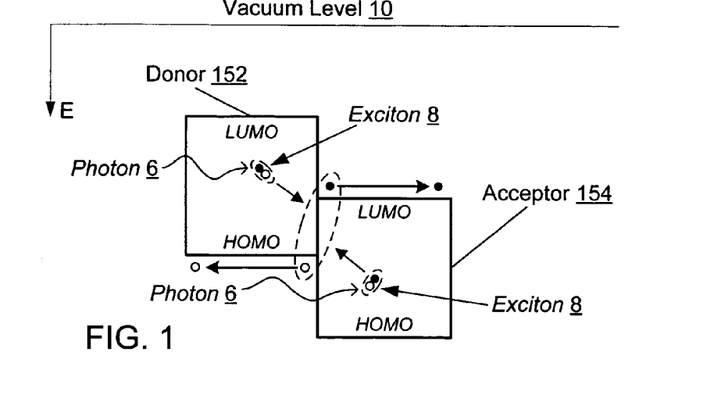
FIG. 1 is an energy level diagram illustrating a donor-acceptor heterojunction.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A method and structure are disclosed which lower the series resistance of photosensitive devices.

The method includes providing an electrode comprising a first electrically conductive material, arranged on a transparent substrate; depositing and patterning a mask over the first electrically conductive material, such that openings in the mask have sloping sides which narrow approaching the substrate; depositing a second electrically conductive material directly onto the first electrically conductive material exposed in the openings of the mask, at least partially filling the openings; stripping the mask, leaving behind reentrant structures of the second electrically conductive material which were formed by the deposits in the openings of the mask; after stripping the mask, depositing a first organic material onto the first electrically conductive material in between the reentrant structures; and depositing a third electrically conductive material over the first organic material deposited in between the reentrant structures, edges of the reentrant structures aligning deposition so that the third electrically conductive material does not directly contact the first electrically conductive material, and does not directly contact the second electrically conductive material.

The second electrically conductive material may have a similar conductivity to the first electrically conductive material, or may be more conductive.

The first electrically conductive material of the transparent electrode may be a metal or a metal substitute. Such metal substitutes include, among other things, oxides and polymers. An example conductive oxide conductive oxide is a degenerate semiconductor oxide.

The second electrically conductive material may be a metal or metal substitute.

The method may further include electrically interconnecting the third electrically conductive material deposited between the reentrant structures. This may be accomplished, among other ways, by forming interconnects/vias as part of a wiring step, or by structuring the reentrant structures so that the third electrically conductive material forms a single continuous layer when deposited.

The steps described above may be used to create a donor-acceptor heterojunction or a Schottky-barrier heterojunction. To form a donor-acceptor heterojunction, the method may further include depositing a second organic material over the first organic material, the first and second organic materials forming a planar, bulk, or hybrid donor-acceptor heterojunction. Alternatively, the method may further include depositing a second organic material with the first organic material, the first and second organic materials forming a mixed, bulk, or hybrid donor-acceptor heterojunction.

To form a Schottky-barrier heterojunction, the first electrically conductive material may be metal, the transparent electrode and the first organic material forming a Schottky-barrier heterojunction. Alternatively, the third electrically conductive material may be metal, the third electrically conductive material and the first organic material forming a Schottky-barrier heterojunction. An example of a structure that may be used for the transparent electrode is a sheet in physical contact with the transparent substrate.

BRIEF DESCRIPTION OF THE DRAWINGS

FIGS. 10A and 10B illustrate a mask that can be used for the step illustrated in FIG. 9B that simplifies creation of a common anode and cathode.

FIGS. 11A and 11B illustrate the conductor patterns resulting from the usage of the mask illustrated in FIGS. 10A and 10B.

The figures are not necessarily drawn to scale.

DETAILED DESCRIPTION

Figure 2:
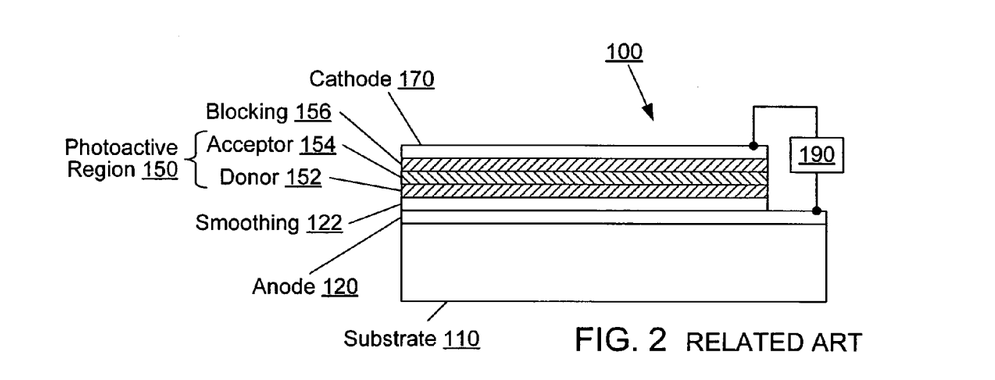
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," Applied Physics Letters 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a material is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
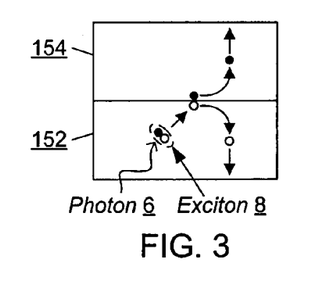
FIG. 3 illustrates a donor-acceptor bilayer forming a planar heterojunction.
Figure 4:
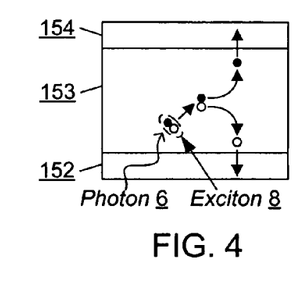
FIG. 4 illustrates a hybrid heterojunction including a mixed heterojunction between a donor layer and an acceptor layer.
Figure 5:
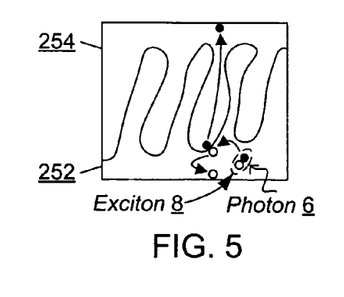
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, U.S. application Ser. No. 10/910,371 entitled "High efficiency organic photovoltaic cells employing hybridized mixed-planar heterojunctions" by Jiangeng Xue et al., filed Aug. 4, 2004, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
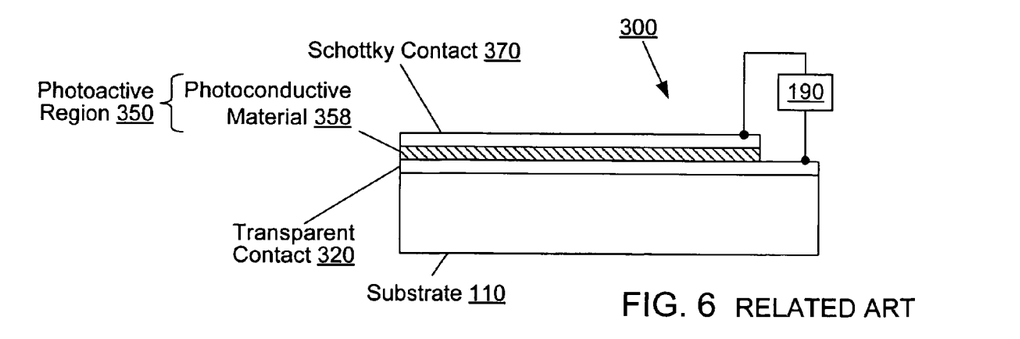
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated are connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semitransparent metal or metal substitute recombination centers comprising nanoclusters, nanoparticles, and/or nanorods, as described for example in U.S. Pat. No. 6,657,378 to Forrest et al.; U.S. patent application Ser. No. 10/915,410 entitled "Organic Photosensitive Devices" by Rand et al., filed Aug. 11, 2004; and U.S. patent application Ser. No. 10/979,145 entitled "Stacked Organic Photosensitive Devices" by Forrest et al., filed Nov. 3, 2004; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
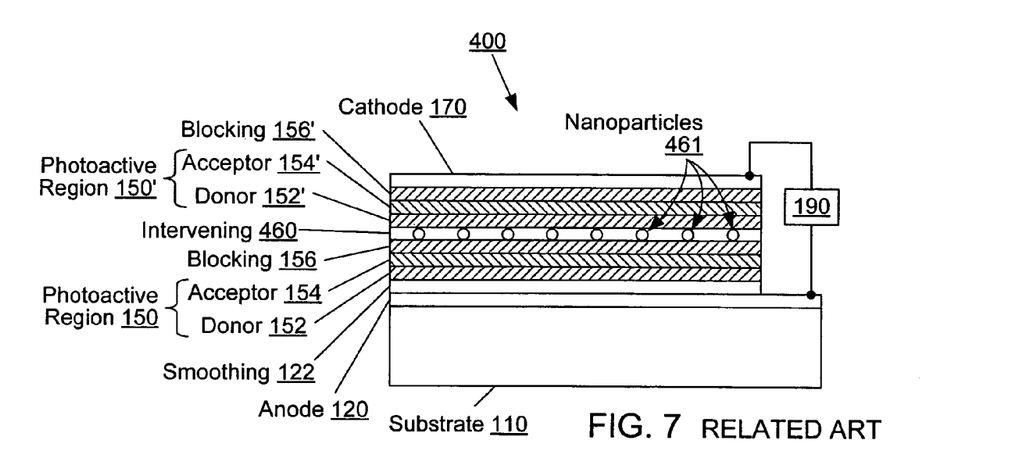
FIG. 7 illustrates tandem photosensitive cells in series.
Figure 8:
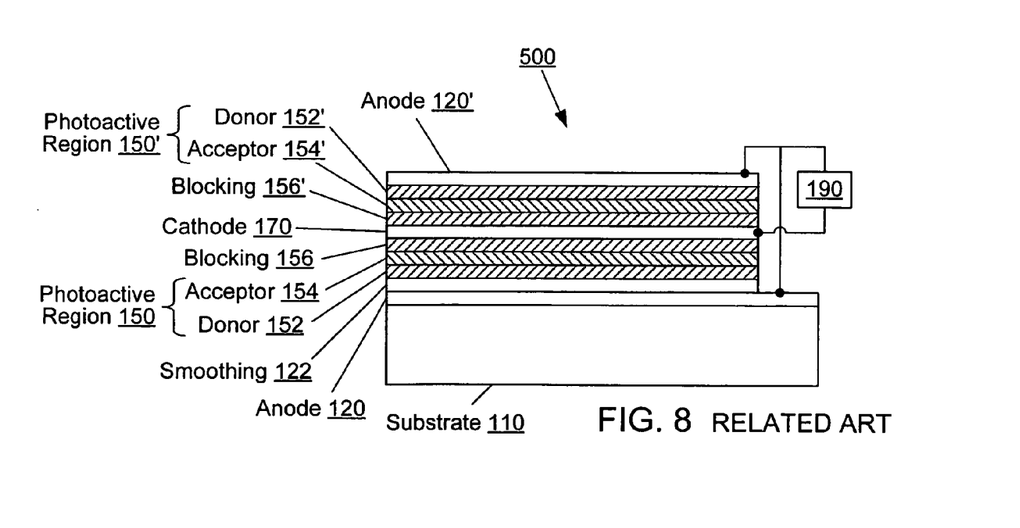
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in U.S. patent application Ser. No. 10/857,747 entitled "Aperiodic dielectric multilayer stack" by Peumans et al., filed Jun. 1, 2004, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

The prevalent designs in contemporary small molecule and polymer photosensitive cells utilize a transparent non-conductive material for substrate 110 and a transparent conductive film for anode 120, with incident light being radiated onto the exposed surface of the substrate. Such designs are limited in efficiency by large series resistance, much of it due to the anode 120, which is generally made thin for reasons of optical transmissivity. In order to boost efficiency, there is a need to produce low cost modules with lower resistance contacts.

Embodiments of the present invention include a method for forming an organic photosensitive device having a transparent substrate-side electrode with improved conductivity, as well as the resulting device.

Figure 9A:
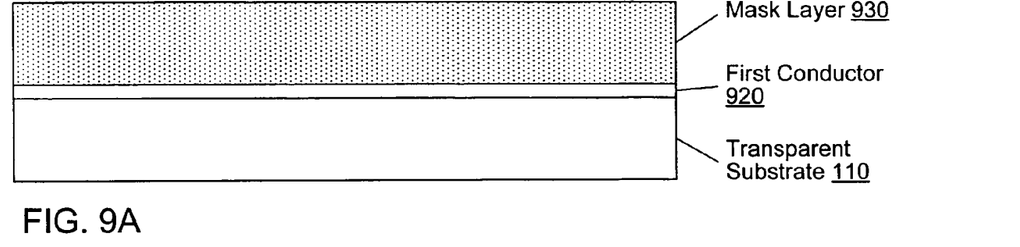
FIGS. 9A-9F illustrate a method for forming an organic photovoltaic device having low resistance contacts.

FIGS. 9A-9F illustrate a method for improving conductivity. In FIG. 9A, a mask layer 930 is formed on a transparent film comprising a first electrically conductive material 920 arranged on an electrically non-conductive, transparent substrate 110. Depending upon the particular application, the transparent film may be continuous or patterned. Examples of a continuous film include a sheet or a coating in physical contact with the substrate 110. The transparent film may serve as an electrode layer, or may serve as one layer of a compound electrode. The mask layer 930 may be made of photoresist or any other material that is easily patterned and appropriate for use as a sacrificial layer.

The first material 920 may comprise a metal or metal substitute, as described above for electrodes and Schottky contacts. Among other things, examples include a conductive oxide or polymer, a thin coating of metal (as defined above to include metal alloys), or a doped semiconductor. An example of a conductive oxide is a degenerate semiconductor oxide, such as indium tin oxide (ITO), gallium indium tin oxide (GITO), and zinc indium tin oxide (ZITO). In particular, ITO is a highly doped degenerate $n^+$ semiconductor with a bandgap of approximately 3.2 eV, rendering it transparent to wavelengths greater than approximately 3900 Å. An example of suitable transparent polymer is polyanaline (PANI) and its chemical relatives.

As described above, the transparent substrate 110 may be rigid or flexible, but rigid is generally preferred for this structure to avoid peeling or separation of layers and short-circuits in the finished device. The substrate may also be planar or non-planar.

Figure 9B:
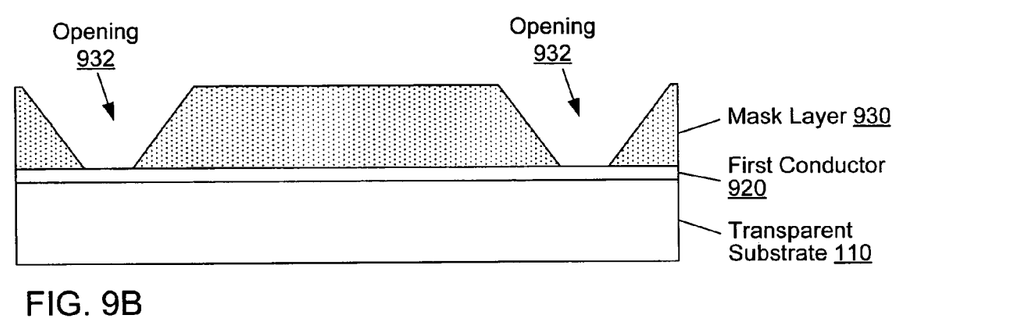
Figure 10A:
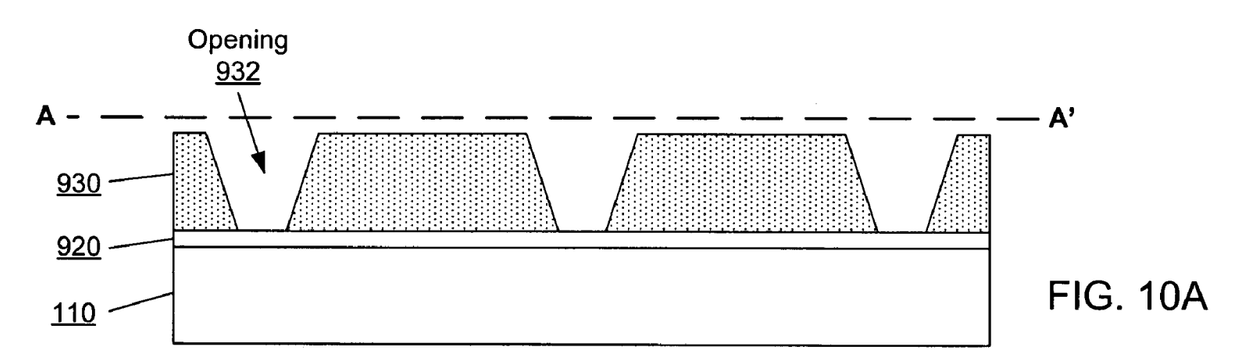
FIG. 10A is a cross section of the structure.
Figure 10B:
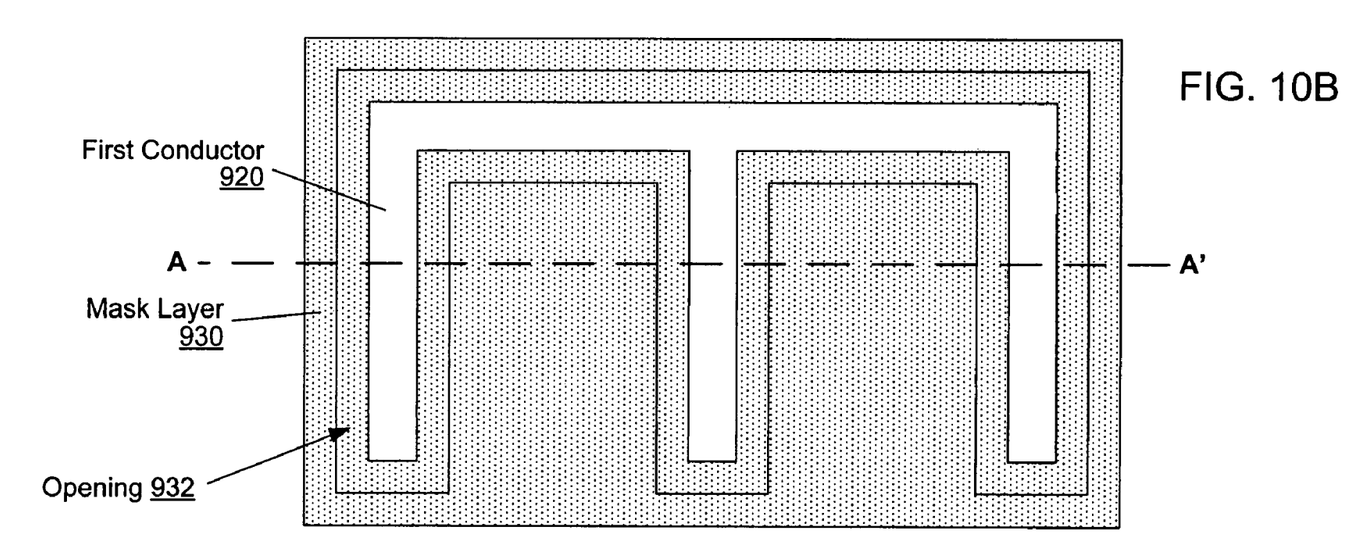
FIG. 10B is an overhead view, with line A-A' providing a frame-of-reference between the figures.

In FIG. 9B, the mask layer 930 is patterned (e.g., photolithography) to create reentrant openings 932 having sloping sides which narrow approaching substrate 110. An example pattern for mask layer 930 is illustrated in FIGS. 10A and 10B. Although it is not required, a benefit of forming the openings 932 as a connected pattern is that wiring is simplified in the finished device.

Figure 9C:
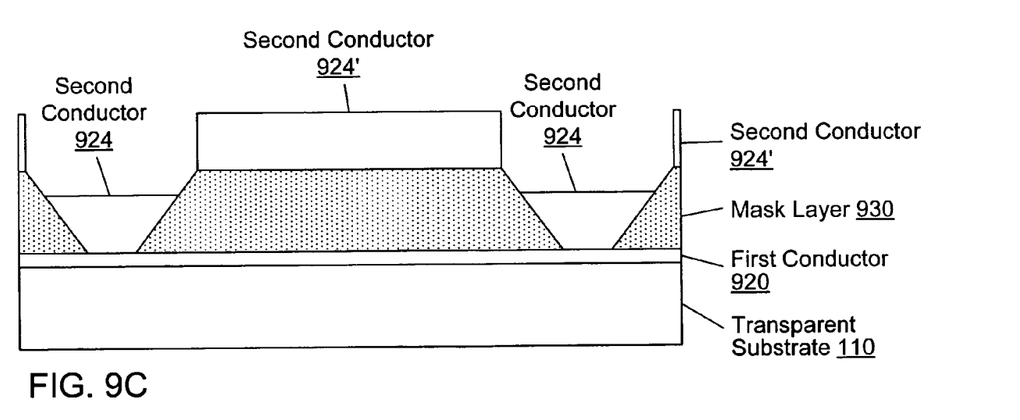

In FIG. 9C, a second electrically conductive material 924 is deposited directly onto the first material 920 exposed in the reentrant openings 932 of the mask 930, at least partially filling the openings 932. The second material 924 may have a conductivity that is the same, or similar to the conductivity of the first material 920, but preferably is more conductive. Examples of the second material 924 include the metal and metal substitutes as described above. The second material 924 may be the same as the first material 920, or may be different.

Figure 9D:
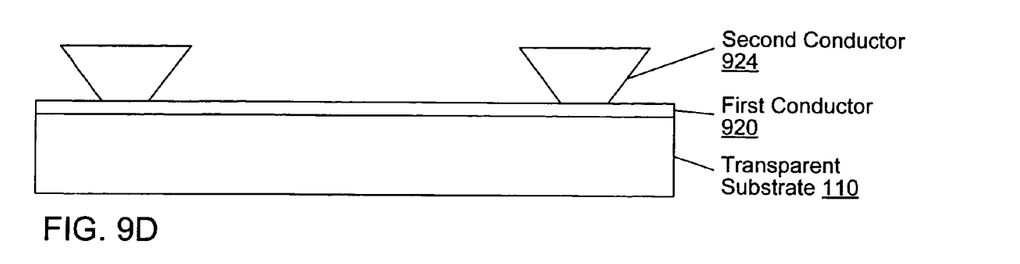

In FIG. 9D, the sacrificial mask layer 930 is stripped away, leaving behind reentrant structures of the second material 924. Reentrant, as used herein, refers to a geometry where the sides of a structure are directed inward, a cross-section of the structure narrowing toward its base (i.e., substrate 110).

Figure 9E:
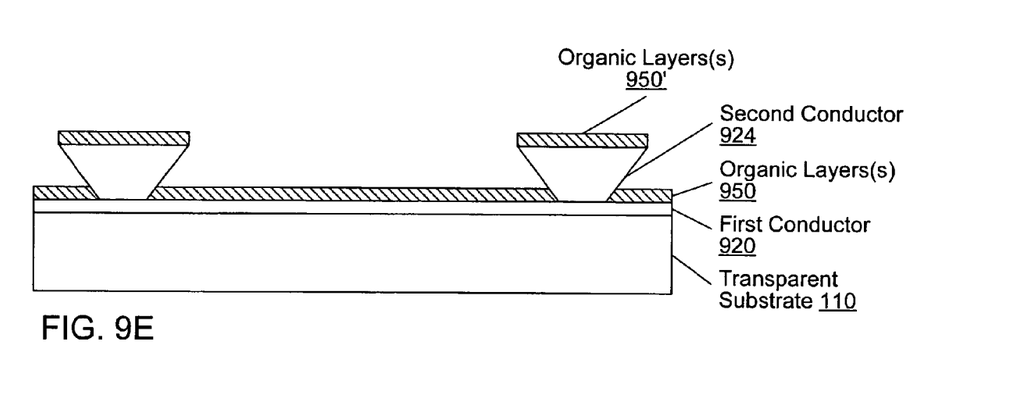

In FIG. 9E, one or more organic layers 950 are deposited. These organic layers 950 include the layer or layers which will be the photoactive region in the finished device. If a donor-acceptor heterojunction is to be formed, organic layers 950 may include donor layers 152, 252, acceptor layers 154, 254, and/or a mixed layer 153, forming a planar, mixed, bulk, or hybrid heterojunction. If a Schottky junction is to be formed, the organic layers 950 may include the photoconductive material 358.

Figure 9F:
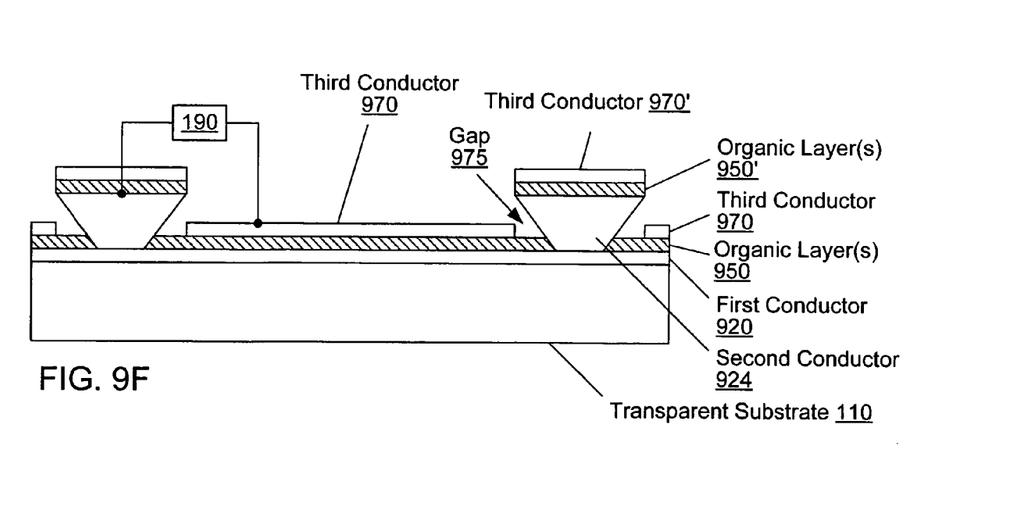
Figure 11A:
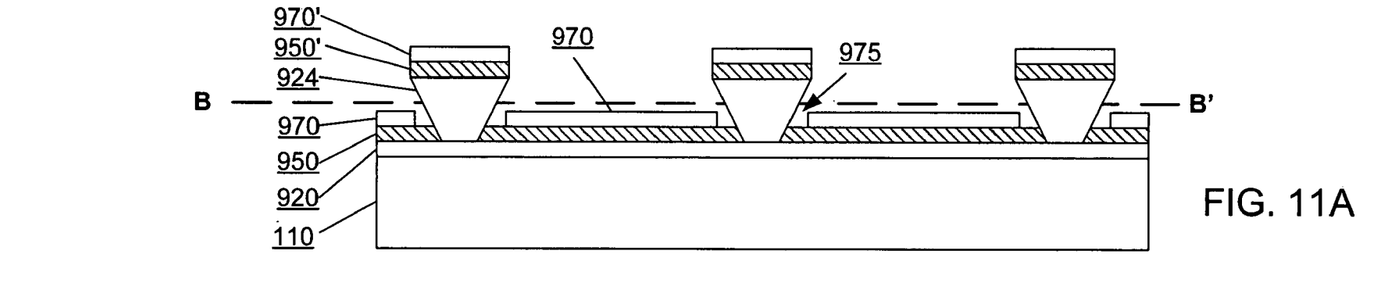
FIG. 11A is a cross section of the structure.
Figure 11B:
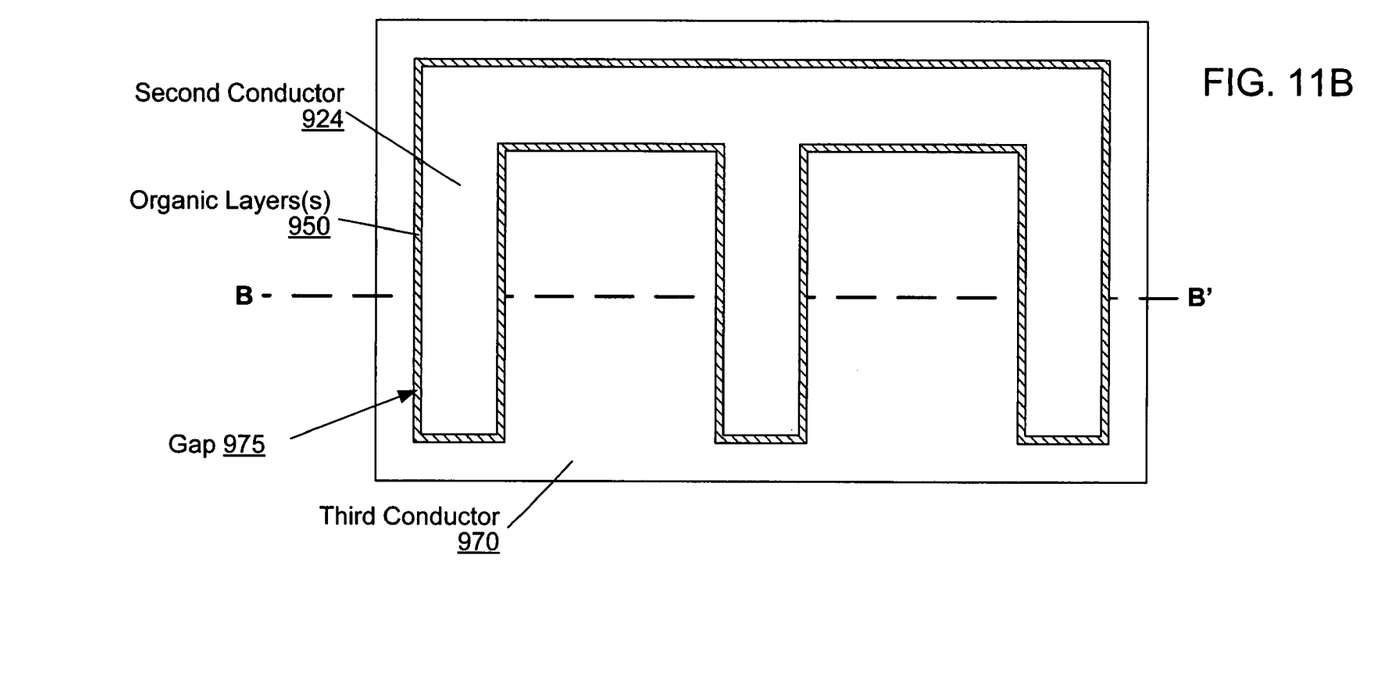
FIG. 11B is an overhead view, with line B-B' providing a frame-of-reference between the figures.

In FIG. 9F, a third electrically conductive material 970 is directionally deposited over the organic material(s) 950 deposited between the reentrant structures 924. Examples of the third material 970 include metal and metal substitutes as described above. By directionally depositing between the reentrant structures of the second material 924, deposition is self aligning. The resulting gaps 975 prevent shorts between the transparent film and reentrant structures and the third material 970. FIGS. 11A and 11B illustrate the corresponding results if using the mask from FIGS. 10A and 10B.

Even if the first material 920 and the second material 924 are the same, the reentrant structures of the second material 924 lowers resistance and provide for increased current densities, in comparison to using the transparent film of the first material 920 alone.

It is not necessary to cap the device. The cells may be wired up by overlaying the electrodes during patterning and deposition. However, if capping or encapsulating is desired, any number of techniques may be used. For example, a coating (e.g., epoxy) may be added after the electrodes are wired. Preferably, the processes used to deposit and pattern any capping material is selected to minimize the thermal and reactive impact on the organic layers 950.

As described above, additional layers not illustrated in the figures may also be deposited. For example, a reflective coating may be deposited over the third conductive material 970; a smoothing layer (122) may be deposited over the first conductive material 920; an anti-reflective coating may be added to the bottom of the substrate 110 and/or between the substrate 110 and the first conductor 920; and an exciton blocking layer (156) may be formed above or below a donor-acceptor heterojunction as part of the organic layers 950. The third conductive material 970 may serve as an electrode layer, or may serve as one layer of a compound electrode.

The self-aligning deposition steps may be used to create a tandem cell. The reentrant structures 924 may be made tall enough (much thicker than the total organic layer thickness in the tandem cell) to prevent shorts. By iteratively repeating process steps, additional photoactive regions and one or more intervening charge recombination layers or charge transfer layers may be added over the organic layer(s) 950, creating a tandem cell including layers as discussed above with FIG. 7.

Similarly, a self-aligning iterative process may be used to include an intermediate electrode and an additional photoactive region, as discussed above with FIG. 8, utilizing the self-aligning process to form the intermediate electrode so as to not have direct contact with the reentrant structures 924. However, as opposed to the normal serial-stacking tandem cell, forming a parallel-connected tandem cell includes creation of an external contact to the intermediate electrode. Additional reentrant structures may optionally be created to contact the intermediate electrode, depending on the thickness and conductivity of the material used for this intermediate electrode.

Conventionally, the first conductive material 920 becomes the anode and the third conductive material 970 becomes the cathode in the finished device. However, an inverted device may be formed by the same process, with the anode on top and the cathode on the bottom. Although described above in the anode-context, smoothing layer 122 may be included in an inverted device to smooth the cathode.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell).

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A method comprising:
providing a transparent film comprising a first electrically conductive material, arranged on a transparent substrate;
depositing and patterning a mask over the first electrically conductive material, such that openings in the mask have sloping sides which narrow approaching the substrate;
depositing a second electrically conductive material directly onto the first electrically conductive material exposed in the openings of the mask, at least partially filling the openings;
stripping the mask, leaving behind reentrant structures of the second electrically conductive material which were formed by said depositing in the openings of the mask;
after said stripping, depositing a first organic material onto the first electrically conductive material in between the reentrant structures; and
depositing a third electrically conductive material over the first organic material deposited in between the reentrant structures, edges of the reentrant structures aligning deposition so that the third electrically conductive material does not directly contact the first and second electrically conductive materials.

2. The method of claim 1, the second electrically conductive material being more conductive than the first electrically conductive material.

3. The method of claim 1, wherein the first electrically conductive material is an oxide or a polymer.

4. The method of claim 3, wherein the oxide is a degenerate semiconductor oxide.

5. The method of claim 3, wherein the second electrically conductive material is a metal.

6. The method of claim 1, wherein the first electrically conductive material of the transparent film is a transparent coating of a metal.

7. The method of claim 1, wherein the second electrically conductive material is a metal.

8. The method of claim 1, further comprising electrically interconnecting the third electrically conductive material deposited between the reentrant structures.

9. The method of claim 1, further comprising depositing a second organic material over the first organic material, the first and second organic materials forming a planar, bulk, or hybrid donor-acceptor heterojunction.

10. The method of claim 1, further comprising depositing a second organic material with the first organic material, the first and second organic materials forming a mixed, bulk, or hybrid donor-acceptor heterojunction.

11. The method of claim 1, wherein the first electrically conductive material is metal, the transparent film and the first organic material forming a Schottky-barrier heterojunction.

12. The method of claim 1, wherein the third electrically conductive material is metal, the third electrically conductive material and the first organic material forming a Schottky-barrier heterojunction.

13. The method of claim 1, wherein said transparent film is a sheet in physical contact with the transparent substrate.

* * * * *